(12) United States Patent
Ozawa

(10) Patent No.: US 8,024,972 B2
(45) Date of Patent: Sep. 27, 2011

(54) ELECTRONIC PART, METHOD FOR FABRICATING ELECTRONIC PART, ACCELERATION SENSOR, AND METHOD FOR FABRICATING ACCELERATION SENSOR

(75) Inventor: Nobuo Ozawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 565 days.

(21) Appl. No.: 12/073,391

(22) Filed: Mar. 5, 2008

(65) Prior Publication Data
US 2008/0229827 A1    Sep. 25, 2008

(30) Foreign Application Priority Data
Mar. 19, 2007    (JP) ................. 2007-071596

(51) Int. Cl.
G01P 15/12    (2006.01)
G01P 1/02    (2006.01)
(52) U.S. Cl. ...................... 73/514.33; 73/493
(58) Field of Classification Search .......... 73/514.33, 73/514.34, 514.36, 514.38, 493
See application file for complete search history.

(56) References Cited

U.S. PATENT DOCUMENTS

| | | | |
|---|---|---|---|
| 6,931,928 B2 * | 8/2005 | Hashimoto et al. | 73/514.33 |
| 6,988,407 B2 * | 1/2006 | Yamaguchi et al. | 73/493 |
| 7,299,696 B2 * | 11/2007 | Saeki | 73/514.33 |
| 7,578,186 B2 * | 8/2009 | Matsuhisa | 73/504.12 |

FOREIGN PATENT DOCUMENTS

| | | |
|---|---|---|
| JP | 1-165640 | 11/1989 |
| JP | 03-202778 | 9/1991 |
| JP | 2005-243932 A | 9/2005 |
| JP | 2005-337874 | 12/2005 |
| WO | WO-00/77843 | 12/2000 |
| WO | WO-00/77844 | 12/2000 |

* cited by examiner

Primary Examiner — Helen C. Kwok
(74) Attorney, Agent, or Firm — Rabin & Berdo, P.C.

(57) ABSTRACT

There is provided an electronic part that has a substrate, an insulating layer formed on the substrate and a pad formed on the insulating layer and is electrically connected with an external terminal and that further includes a cavity formed at least at either one of the substrate corresponding to a bottom surface of the electrode pad and a region of the insulating layer. It provides a highly reliable electronic part, its fabrication method as well as an acceleration sensor using the electronic part and its fabrication method.

22 Claims, 12 Drawing Sheets

ELECTRONIC PART, METHOD FOR FABRICATING ELECTRONIC PART, ACCELERATION SENSOR, AND METHOD FOR FABRICATING ACCELERATION SENSOR

CROSS-REFERENCE TO RELATED APPLICATION

This application claims priority under 35 USC 119 from Japanese Patent Application No. 2007-071596, the disclosure of which is incorporated by reference herein.

BACKGROUND OF THE INVENTION

1. Field of the Invention

The present invention relates to an electronic part, a method for fabricating the same, an acceleration sensor and a method for fabricating the same. More specifically, the invention relates to a MEMS fabricated by utilizing micro-machining, a method for fabricating the same, an acceleration sensor utilizing the MEMS and a method for fabricating the same.

2. Description of Related Art

MEMS (Micro Electro Mechanical Systems) is a functional part in which mechanical elements and electrical elements are combined. As one example of the MEMS, there is a piezoresistant-type acceleration sensor (see Japanese Patent Application Laid-open No. 03-202778 (JP Patent No. 2127840) for example).

FIG. 17 is substantially a section view of a piezoresistant-type acceleration sensor. When a force caused by acceleration is applied to a dead-weight 82a of the piezoresistant-type acceleration sensor 500, a flexible section 74a deflects and a resistance value of a piezoresistant element (not shown) assembled into the flexible section 74a changes. The changes of current or voltage caused by this change of the resistance value is taken out to the outside from an electric wire (not shown) connected to the piezo resistance via a pad (not shown) formed on an upper surface of an fixing section 76a and a bonding wire 90a electrically connected to that and through an outside wiring electrode 88a. The sensor is enabled to detect the acceleration by detecting this change.

FIG. 18 is an enlarged section view near the pad 92a. The piezo resistances 94a are provided on a surface layer portion of the flexible section 74a and the metal pad 92a is connected with the piezo resistances 94a by an electric wire (not shown). The bonding wire 90a is electrically connected with the metal pad 92a.

Meanwhile, when ambient temperature of the acceleration sensor changes, thermal stress is generated due to a difference of thermal expansion coefficient of members used in the acceleration sensor, causing erroneous operation.

There has been disclosed a technology of relaxing the thermal stress in Japanese Patent Application Laid-Open No. 2005-337874 for example.

There has been also disclosed a technology of providing resin at a center part of a metal post that forms a part connecting a substrate and an element to relax bonding stress caused in connecting the element provided on the substrate with another substrate by means of a bump and thermal stress caused by the difference of thermal expansion coefficient of those substrates in Republished Patent Nos. WO00/77843 and WO00/77844 for example.

However, even if such function for relaxing the thermal and bonding stress is given, performance of a mechanical element changes in general due to changes of external stress acting on the part of the mechanical element, disabling often to obtain desirable characteristics.

For instance, methods of physically press-bonding by means of ultrasonic and heat are used in connecting the bonding wire 90a to the pad 92a in an acceleration sensor shown in FIG. 18. External stress is applied to a part connecting the bonding wire 90a with the pad 92a when such press-bonding is carried out. Then, there is a problem that the piezoresistant element 94a provided in the flexible section 74a may operate erroneously.

Still more, there is a possibility of deforming or damaging the flexible section 74a in forming the bonding wire 90a on the acceleration sensor due to an impact in connecting the bonding wire 90a to the acceleration sensor for example. There is also a possibility of deforming or damaging the flexible section 74a in the same manner in providing the bump to the acceleration sensor due to an impact in connecting the acceleration sensor to a semiconductor device by the bump.

Still more, there is a problem even if the aforementioned countermeasure for relaxing the thermal stress is taken, tension of the bonding wire 90a in FIG. 17 acts on the flexible section 74a, disabling to correctly detect the acceleration. There is also a problem in directly connecting the piezoresistant-type acceleration sensor 500 with a semiconductor device that stress of a connecting part may act directly on the piezoresistant-type acceleration sensor 500, inducing a deadly characteristic fluctuation.

The problems as described above are actualized when the bonding wire 90a is shortened so that it deflects less in order to accommodate with micronization of electronic part.

SUMMARY OF THE INVENTION

The present invention has been made in view of the problems described above and achieves the following object.

That is, it is the object of the invention to provide a reliable electronic part and a fabrication method of the same as well as to provide an acceleration sensor using the electronic part and its fabrication method.

As a result of ardent study of the inventors, the inventors achieved the object by finding that the aforementioned problems may be solved by using the fabrication methods of the electronic part described below.

That is, according to a basic aspect of the invention, there is provided an electronic part, including: a substrate; an insulating layer formed on the substrate; and an electrode pad formed on the insulating layer and electrically connected with an external terminal, wherein a cavity is formed at least one of a region of the substrate corresponding to a bottom surface of the electrode pad and the insulating layer.

Furthermore, the electrode pad may be connected with an external terminal through an intermediary of the bonding wire.

The electrode pad may be connected with the external terminal also through an intermediary of a bump.

According to the electronic part of the basic aspect of the invention, the pad and others deflect within the cavity due to external stress caused in connecting the bonding wire or bump, so that it becomes possible to suppress the external stress caused in connecting the bonding wire or bump from exerting its influence on regions other than the part connecting the bonding wire or bump. Still more, even if the bonding wire or bump expand due to changes of ambient temperature of the electronic part, it becomes possible to relax the stress caused by the expansion by the deflection of the pad and others.

According to a first aspect of the invention, the electronic part may be arranged so that the cavity is formed in the region of the substrate and contacts with the insulating layer.

According to a second aspect of the invention, the electronic part may be arranged so that the cavity is formed in the region of the substrate and within the substrate.

According to the electronic part of the first and second aspects of the invention, the electronic part may be formed by the conventional method after creating the cavity because the insulating layer and the pad are formed after creating the cavity in addition to that it can relax the stress caused by the bonding wire or the bump.

According to a third aspect of the invention, the electronic part may be arranged so that the cavity is formed in the region of the insulating layer.

According to a fourth aspect of the invention, the electronic part may be arranged so that the cavity contacts with the substrate.

According to a fifth aspect of the invention, the electronic part may be arranged so that the cavity contacts with the electrode pad.

According to a sixth aspect of the invention, the electronic part may be arranged so that the cavity contacts with the substrate and the electrode pad.

According to the electronic parts of the third through sixth aspects of the invention, it is possible to suppress the strength of the substrate from dropping because the cavity is formed in the region of the insulating layer in addition to that it can relax the stress caused by the bonding wire or the bump.

According to a seventh aspect of the invention, the electronic part may be arranged so that the cavity is formed across the region of the insulating layer and the region of the substrate and contacts with the electrode pad.

According to the electronic part of the seventh aspect of the invention, it can fully relax the stress caused by the bonding wire or the bump because a volume of the cavity is large in addition to that it can relax the stress caused by the bonding wire or the bump.

The acceleration sensor of the invention has an excellent reliability because it includes the electronic part of the first through seventh aspects and can relax the stress caused by the bonding wire or the bump.

A method for fabricating the electronic part of the invention containing a substrate, an insulating layer formed on the substrate and an electrode pad formed on the insulating layer and is electrically connected with an external terminal further includes a step of providing a cavity formed at least at either one of the substrate corresponding to a bottom surface of the electrode pad and a region of the insulating layer.

A method for fabricating the acceleration sensor of the invention having a dead-weight section and a fixing section surrounding the dead-weight section and having an electrode pad, wherein the dead-weight section is flexibly connected with the fixing section, having a step of forming an insulating layer on the fixing section, a step of forming an electrode pad formed on the insulating layer and is electrically connected with acceleration detecting means of the acceleration sensor and a step of forming a cavity at least at either one of the substrate corresponding to a bottom surface of the electrode pad and a region of the insulating layer.

It becomes possible to fabricate the aforementioned electronic part or the acceleration sensor by the method of fabricating the electronic part and acceleration sensor of the invention.

Thus, it becomes possible to provide the highly reliable electronic part and its fabrication method as well as the acceleration sensor and its fabrication method by the invention.

BRIEF DESCRIPTION OF THE DRAWINGS

Preferred exemplary embodiments of the present invention will be described in detail based on the following figures, wherein.

DETAILED DESCRIPTION OF THE INVENTION

The best mode for carrying out electronic part of the invention will be explained below with reference to the drawings. It is noted that there is a case when overlapped explanation is omitted.

<Electronic Part>

An electronic part of the invention is an electronic part that includes a substrate, an insulating layer formed on the substrate, and a pad formed on the insulating layer, and is electrically connected with an external terminal and that further includes a cavity formed at least at either one of the substrate corresponding to a bottom surface of the electrode pad and a region of the insulating layer.

The external terminal is connected with the electrode pad through an intermediary of a bonding wire or a bump.

It becomes possible to relax external stress caused by the bonding wire or the bump by providing the cavity at least at either one of the substrate corresponding to the bottom surface of the electrode pad and the region of the insulating layer.

The "region of the substrate corresponding to the bottom surface of the electrode pad", the "region of the insulating layer corresponding to the bottom surface of the electrode pad" and the "cavity" will be explained below in detail. It is noted that one in which the external terminal is connected with the electrode pad via the bonding wire will be explained below.

[Region of Substrate Corresponding to Bottom Surface of Electrode Pad]

Figure 1:
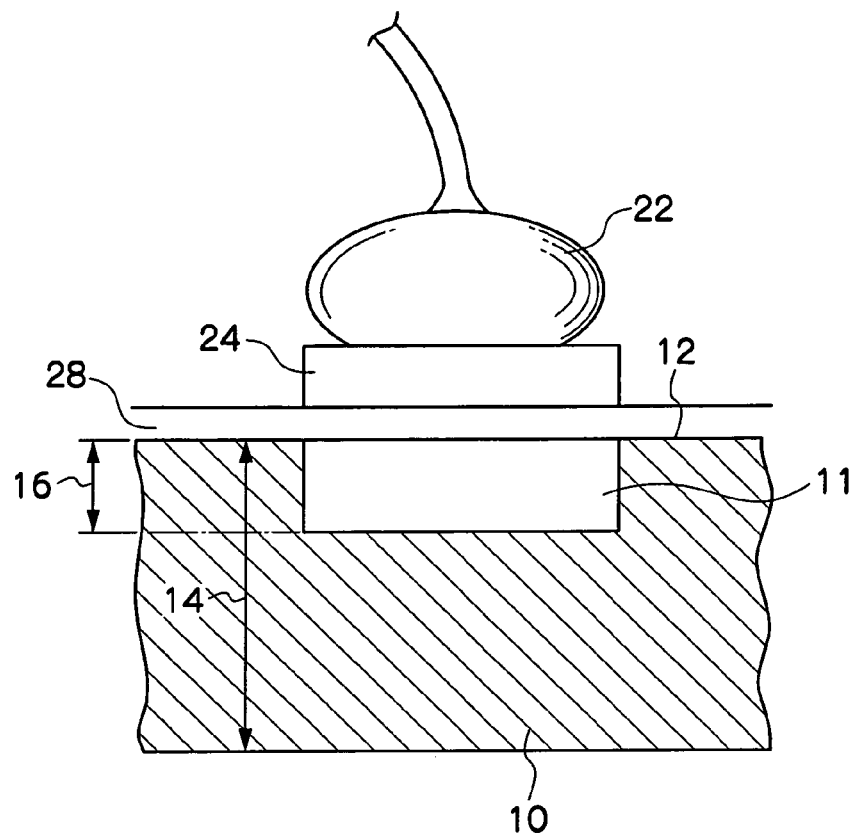
FIG. 1 is a section view of an electronic part showing position of a cavity when the cavity is located in a region of a substrate in the electronic part of the invention.

The region of the substrate corresponding to the bottom surface of the electrode pad represents position of the cavity 11 that is (I) located in an upper part of the substrate 10 and that (II) corresponds to a bottom surface of the pad 24 as shown in FIG. 1.

I. Upper Part of Substrate

The upper part 16 of the substrate in FIG. 1 represents a region indicated by 0.5 to 20% of depth of a thickness 14 of the substrate 10 on the side of the substrate 10 from a surface 12 of the substrate 10 on the side of the insulating layer bordering the bottom surface of the pad 24. When the thickness 14 of the substrate 10 is 100 μm for example, the upper part of the substrate 10 is a region indicated by a depth of more than 5 μm and less than 20 μm from the surface 12 of the substrate 10 on the side of the insulating layer. A more preferable aspect of the depth is more than 5% and less than 10%.

II. Position of Cavity Corresponding to Bottom Surface of Pad

Figure 2:
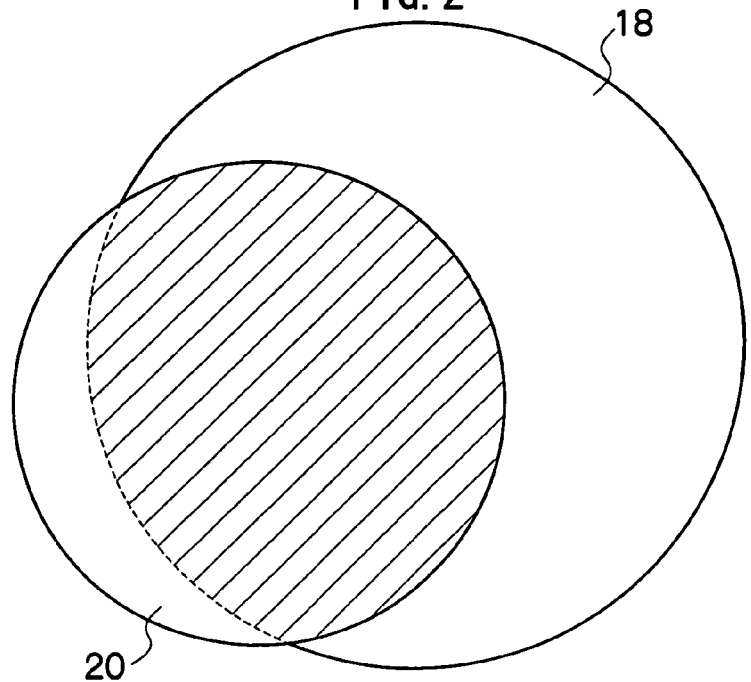
FIG. 2 is a drawing representing the position of the cavity corresponding to a bottom surface of a pad in the electronic part in a mode for carrying out the invention.

The position of the cavity corresponding to the bottom surface of the pad is such position that more than 80% of a surface 20 of the cavity 11 overlaps with the bottom surface 18 of the pad 24 as shown in FIG. 2 that is a figure seen from the side of the substrate 10 in FIG. 1. The pad under the bonding wire can fully bend when the cavity is located within the range described above, so that the stress may be fully relaxed. A more preferable aspect is 100%. A most preferable aspect is the position where the center of gravity of the bottom surface of the pad overlaps with the center of gravity of the cavity. The bonding wire is connected with the pad in the region overlapping with the cavity.

[Region of Insulating Layer Corresponding to Bottom Surface of Electrode Pad]

The region of the insulating layer corresponding to the bottom surface of the electrode pad is position (III) within the insulating layer 28 and (IV) of the cavities 31 through 34 corresponding to the bottom surface of the pad 24 as shown in FIGS. 5 through 8 of third through sixth embodiments of the invention.

III. Within Insulating Layer

Figure 5:
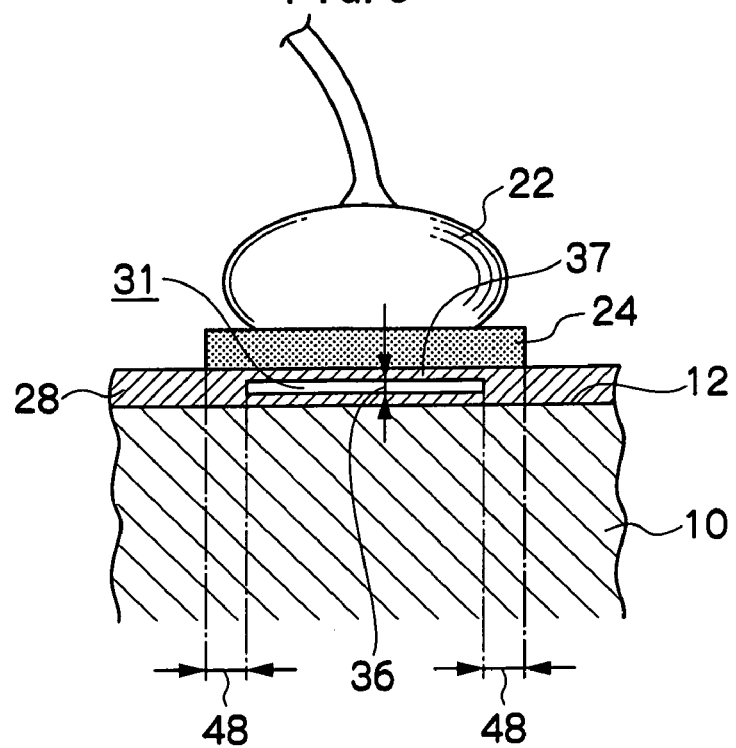
FIG. 5 is a section view of a third embodiment in the electronic part in the mode for carrying out the invention.
Figure 6:
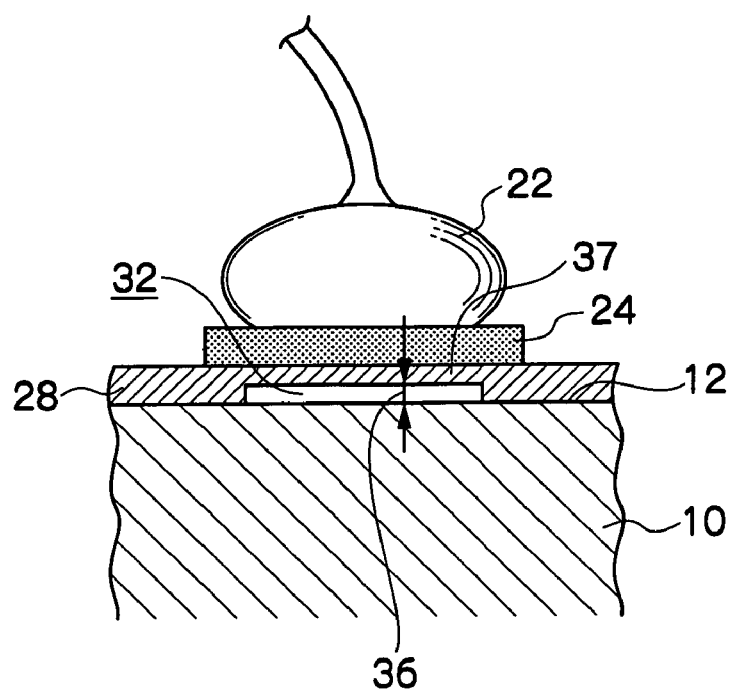
FIG. 6 is a section view of a fourth embodiment in the electronic part in the mode for carrying out the invention.
Figure 7:
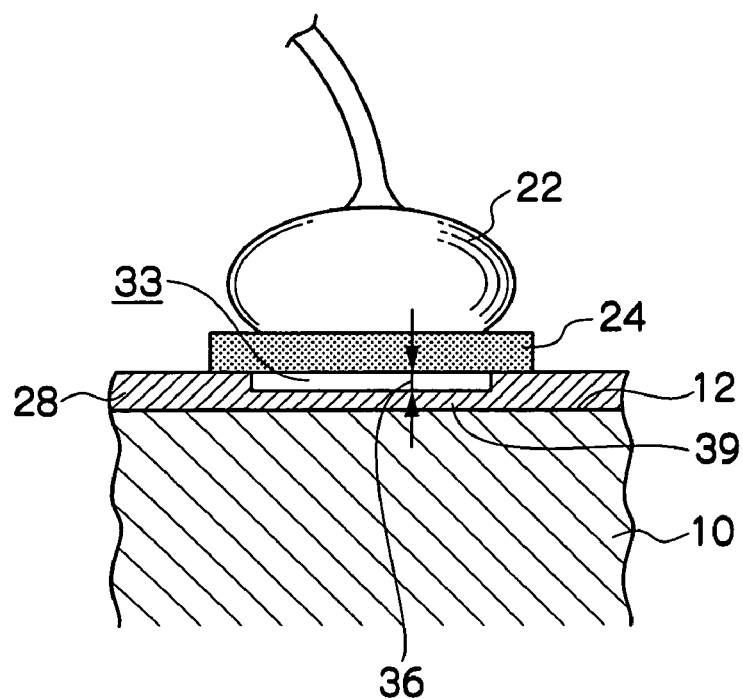
FIG. 7 is a section view of a fifth embodiment in the electronic part in the mode for carrying out the invention.
Figure 8:
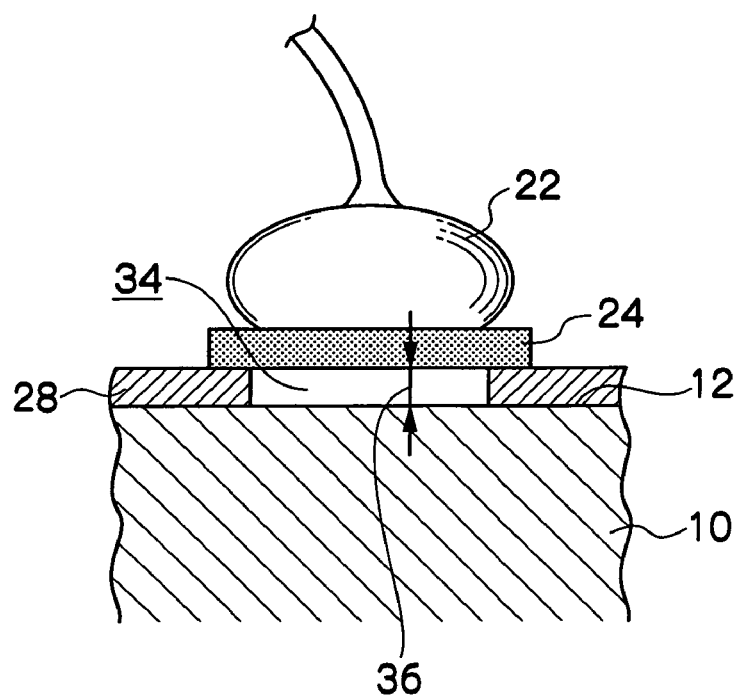
FIG. 8 is a section view of a sixth embodiment in the electronic part in the mode for carrying out the invention.

The position within the insulating layer is that the cavity 31 is located within the insulating layer 28 as shown in FIG. 5, that the cavity 32 is located at position contacting with the substrate 10 as shown in FIG. 6, that the cavity 33 is located at position contacting with the pad 24 as shown in FIG. 7 or that the cavity 34 is located at position contacting with the pad 24 and the substrate 10 as shown in FIG. 8.

IV. Position of Cavity Corresponding to Bottom Surface of Pad

This is the same with the positional relationship shown in FIG. 2

[Cavity]

The "cavity" in the invention is a space having a predetermined shape. Although the cavity here may be any type as long as it can relax the external stress caused in connecting the bonding wire, a preferable aspect of the cavity that fully relaxes the external stress may be appropriately selected by its depth, shape, area of an upper surface thereof and the like.

The depth, shape and area of the upper surface of the cavity will be described below in detail.

—Depth of Cavity—

The depth of the cavity of the invention must be larger than the deflection of the pad in connecting the bonding wire. It becomes possible to provide a highly reliable electronic part when the depth of the cavity is larger than the deflection because it fully relaxes the external stress caused in connecting the bonding wire and suppresses an erroneous operation that otherwise occurs when the element is damaged by the stress. Preferably, the depth is more than one time and less than 10 times of the deflection of the pad or more preferably, more than two times and less than five times of the deflection. It is not preferable to be 10 times or more because strength of the substrate drops. It is noted that even if the depth of the cavity is 10 times of the deflection of the cavity, the depth of the cavity will not reach to position deeper than the upper part 16 of the substrate that is a depth of 20% of the thickness 14.

—Shape of Cavity—

The shape of the cavity of the invention represents the shape of the cavity seen from the surface of the substrate. It is preferable to be circular or oval from a point of view of relaxing the stress regardless of directions from which the external stress is applied.

—Area of Upper Surface of Cavity—

The area of the upper surface of the cavity is preferable to be more than 70% and less than 130% of the area of the bottom surface of the pad or more preferable to be more than 80% and less than 100%. It is possible to relax the external stress because the pad can fully deflect when the size of the area is within this range. In case when the invention is applied to an acceleration sensor, it is not preferable for the cavity to extend to the flexible section of the acceleration sensor from points of view that mechanical strength of the flexible section drops and the flexible section becomes liable to be broken and that the cavity relaxes even strain to be sensed by a piezoresistant element embedded into the flexible section.

—Number of Cavities—

Although there may be provided any number of cavities as long as they meet the position corresponding to the bottom surface of the pad, the depth, the shape and area, it is preferable to be an odd number or more preferably to be three and most preferably to be one from a point of view of fully relaxing the external stress from the bonding wire.

When there are a plural number of cavities, it is preferable to have one cavity at position where the center of gravity of any one of the cavities coincides with the center of gravity of the pad. Furthermore, when there are a plural number of cavities, they may exist in the film-thickness direction of the substrate.

Specifically preferable first through seventh embodiments among them will be described below in detail.

First Embodiment

As a first preferable aspect, the electronic part of the invention has a structure in which the cavity 26 is formed in the region of the substrate 10 and contacts with the insulating layer 28. It becomes possible to fully relax the external stress caused by the bonding wire 22 by forming the cavity 26 into a shape of a membrane surrounded by a concave of the substrate 10 and the insulating layer 28.

Figure 3:
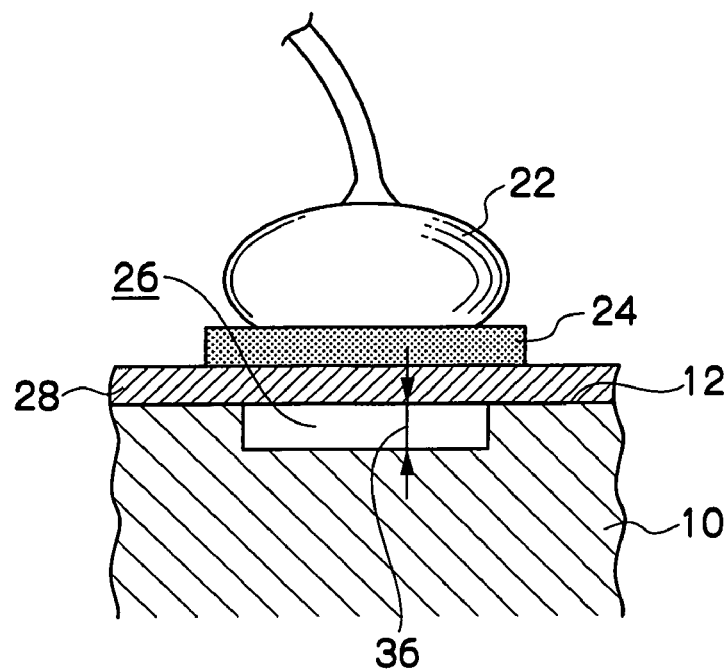
FIG. 3 is a section view of a first embodiment in the electronic part in the mode for carrying out the invention.

FIG. 3 is a section view of the electronic part having the substrate 10, the bonding wire 22, the pad 24, the cavity 26 and the insulating layer 28. The cavity 26 is located at the position where the surface of the cavity 26 contacts with the surface of the insulating layer 28 on the side of the substrate 10. In this case, the pad 24 and the insulating layer 28 deflect together when the bonding wire 22 is connected. That is, they deflect in such a direction in which the surface of the insulating layer 28 on the side of the substrate contacts with a bottom surface of the cavity 26.

As for a combination of the depth 36 of the cavity 26, the shape of the cavity 26, the area of the upper surface of the cavity 26 and the position corresponding to the bottom surface of the pad 24, it is preferable to be such that the depth 36 of the cavity 26 is larger than one time and less than 10 times of a deflection of the pad 24, the shape of the cavity 26 is circular or oval, the area of the upper surface of the cavity 26 is more than 80% and less than 100% of the area of the bottom surface of the pad 24 and the position corresponding to the bottom surface of the pad 24 is the position where the surface area of the cavity 26 overlaps with the bottom surface of the pad 24 by 100% when seen from the lower side of the insulating layer 28 as shown in FIG. 2. The most preferable aspect thereof is the position where the center of gravity of the bottom surface of the pad 24 overlaps with the center of gravity of the cavity 26 when seen from the lower part of the insulating layer 28 as shown in FIG. 2.

Here, a material of the substrate 10 may be silicon, a material of the pad 24 may be Cu or Al and a material of the insulating layer 28 may be a silicon oxide film.

From an aspect of ductility and flexibility of the bonding wire 22, its diameter is preferable to be 20 to 50 μm and its material to be gold.

Fabrication Method of First Embodiment

A fabrication method of a first embodiment will be explained by using FIG. 10.

The insulating layer 28 is formed on the substrate 10 and etching holes 40 are formed on the position where the cavity 26 is to be formed by a known technology. Next, the cavity 26 is formed by means of wet etching and then the insulating layer 28 is formed so as to cover the etching hole 40 by means of CVD for example. After than, the pad 24 is formed on the cavity through the intermediary of the insulating layer 28 and then the bonding wire 22 is connected with the pad 24.

Etching solution used here in the wet etching may be potassium hydroxide (KOH), tetramethylammonium hydroxide (TMAH) and the like for example.

Second Embodiment

As a second embodiment, the electronic part of the invention has a structure in which the cavity 30 is formed within the substrate 10. It becomes possible to fully relax the external stress caused by the bonding wire 22 by forming the cavity 30 into a shape of a membrane surrounded by a concave of the substrate 10 and a layer 38 between a surface of the cavity 30 and the insulating layer 28.

Figure 4:
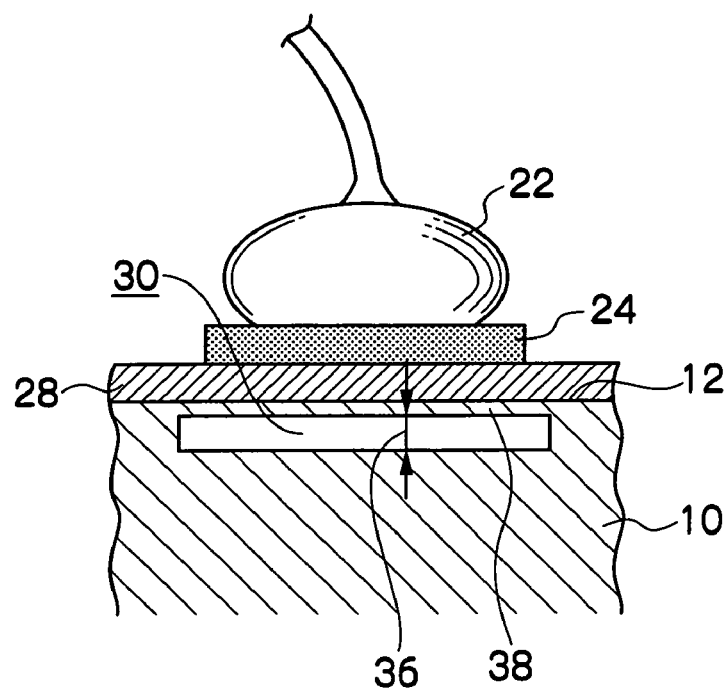
FIG. 4 is a section view of a second embodiment in the electronic part in the mode for carrying out the invention.

FIG. 4 is a section view of the electronic part having the substrate 10, the bonding wire 22, the pad 24, the cavity 30 and the insulating layer 28. The cavity 30 is located with the substrate 10. In this case, the pad 24, the insulating layer 28 and the layer 38 between the surface of the cavity 30 and the insulating layer 28 deflect together when the bonding wire 22 is connected. That is, they deflect in such a direction in which the upper surface of the cavity 30 contacts with a bottom surface of the cavity 30.

As for a combination of the depth 36 of the cavity 30, the shape of the cavity 30, the area of the upper surface of the cavity 30 and the position corresponding to the bottom surface of the pad 24, it is preferable to be such that the depth 36 of the cavity 30 is larger than one time and less than 10 times of a deflection of the pad 24, the shape of the cavity 30 is circular or oval, the area of the upper surface of the cavity 30 is more than 80% and less than 100% of the area of the bottom surface of the pad 24, a thickness of the layer 38 between the surface of the cavity 30 and the insulating layer 28 is 10% to 50% of the depth 36 of the cavity 30 and the position corresponding to the bottom surface of the pad 24 is the position where the surface area of the cavity 30 overlaps with the bottom surface of the pad 24 by 100%.

Here, the materials of the substrate 10, the pad 24, the insulating layer 28 and the bonding wire 22 are the same with those in the first embodiment.

Fabrication Method of Second Embodiment

A fabrication method of the second embodiment will be explained by using FIG. 11.

After forming a silicon oxide film 44 at parts of the substrate 10 that become etching holes, boron is doped to silicon substrate region 45 not covered by the silicon oxide film 44 by thermal diffusion with concentration of $1 \times 10^{19} / cm^3$ or more and the silicon oxide film 44 is removed by wet etching. Next, the cavity 30 is formed on the silicon substrate by utilizing that the silicon region doped by high-density boron is not etched and the same material with the substrate 10 for example is formed so as to cover the etching hole 40 by CVD for example. Then, the insulating layer 28 is formed on the surface of the substrate 10 and the pad 24 and the bonding wire 22 are sequentially formed.

Third Embodiment

As a third embodiment, the electronic part of the invention has a structure in which a cavity 31 is formed within the insulating layer 28. It becomes possible to fully relax the external stress caused by the bonding wire 22 by forming the cavity 31 into a shape of a membrane covered by the insulating layer 28.

FIG. 5 is a section view of the electronic part having the substrate 10, the bonding wire 22, the pad 24, the cavity 31 and the insulating layer 28. The cavity 31 is located within the insulating layer 28. In this case, the pad 24 and a layer 38 between a surface of the cavity 31 and the bottom surface of the pad 24 deflect together when the bonding wire 22 is connected. That is, they deflect in such a direction in which the upper surface of the cavity 31 contacts with a bottom surface of the cavity 31.

As for a combination of the depth 36 of the cavity 31, the shape of the cavity 31, the area of the upper surface of the cavity 31 and the position corresponding to the bottom surface of the pad 24, it is preferable to be such that the depth 36 of the cavity 31, i.e., a thickness of the insulating layer 28, is larger than one time and less than 10 times of a deflection of the pad 24, the shape of the cavity 31 is circular or oval, the area of the upper surface of the cavity 31 is more than 50% and less than 90% of the area of the bottom surface of the pad 24 and a gap 48 between an outer periphery of the pad 24 and an outer periphery of the cavity 31 is 5% or more of a diameter of the pad.

Here, the materials of the substrate 10, the pad 24, the insulating layer 28 and the bonding wire 22 are the same with those in the first embodiment.

Fourth Embodiment

As a fourth embodiment, the electronic part of the invention has a structure in which a cavity 32 is formed within the insulating layer 28 and the cavity 32 contacts with the substrate 10. It becomes possible to fully relax the external stress caused by the bonding wire 22 by forming the cavity 32 into a shape of a membrane covered by a layer 37 between a surface of the cavity 32 and the bottom surface of the pad 24, the insulating layer 28 and the substrate 10.

FIG. 6 is a section view of the electronic part having the substrate 10, the bonding wire 22, the pad 24, the cavity 32 and the insulating layer 28. In this case, the pad 24 and the layer 37 between the surface of the cavity 32 and the bottom surface of the pad 24 deflect together when the bonding wire 22 is connected. That is, they deflect in such a direction in which the upper surface of the cavity 32 contacts with the bottom surface of the cavity 32.

A combination of the depth 36 of the cavity 32, the shape of the cavity 32, the area of the upper surface of the cavity 32 and the position corresponding to the bottom surface of the pad 24 is the same with the third embodiment.

Here, the materials of the substrate 10, the pad 24, the insulating layer 28 and the bonding wire 22 are the same with those in the first embodiment.

Fifth Embodiment

As a fifth embodiment, the electronic part of the invention has a structure in which a cavity 33 is formed within the region of the insulating layer 28 and the cavity 33 contacts with the pad 24. It becomes possible to fully relax the external stress caused by the bonding wire 22 by forming the cavity 33 into a shape of a membrane covered by a layer between a bottom surface of the cavity 33 and the substrate 10, the insulating layer 28 and the pad 24.

FIG. 7 is a section view of the electronic part having the substrate 10, the bonding wire 22, the pad 24, the cavity 33 and the insulating layer 28. In this case, the pad 24 deflects when the bonding wire 22 is connected. That is, it deflects in such a direction in which the upper surface of the cavity 33 contacts with a bottom surface of the cavity 33.

A combination of the depth 36 of the cavity 33, the shape of the cavity 33, the area of the upper surface of the cavity 33 and the position corresponding to the bottom surface of the pad 24 is the same with the fourth embodiment.

Here, the materials of the substrate 10, the pad 24, the insulating layer 28 and the bonding wire 22 are the same with those in the first embodiment.

Sixth Embodiment

As a sixth embodiment, the electronic part of the invention has a structure in which a cavity 34 contacts with the substrate 10 and the pad 24. It becomes possible to fully relax the external stress caused by the bonding wire 22 by forming the cavity 34 into a shape of a membrane covered by the substrate 10 and the pad 24.

FIG. 8 is a section view of the electronic part having the substrate 10, the bonding wire 22, the pad 24, the cavity 34 and the insulating layer 28. The cavity 34 has the same depth with a thickness of the insulating layer 28. It becomes possible to relax the external stress as the pad 24 deflects.

A combination of the depth 36 of the cavity 34, the shape of the cavity 34, the area of the upper surface of the cavity 34 and the position corresponding to the bottom surface of the pad 24 is the same with the fourth embodiment.

Here, the materials of the substrate 10, the pad 24, the insulating layer 28 and the bonding wire 22 are the same with those in the first embodiment.

The electronic part in which the cavity is formed in the region of the insulating layer as described in the third to sixth embodiments may be fabricated by the following method of a sixth embodiment.

Fabrication Method of Sixth Embodiment

A fabrication method of a sixth embodiment will be explained by using FIG. 12.

The substrate 10 on which the insulating layer 28 is formed is prepared. Then, an aluminum film 29 that is a material of the pad is formed and the pad 24 having etching holes 46 is formed by a known lithography technology. Next, isotropic wet etching is carried out by a mixed solution of ammonium fluoride, ammonium hydrogen fluoride and acetic acid to form a cavity 34 in the insulating layer 28 composed of a silicon oxide film without etching the aluminum film. After that, the bonding wire 22 is connected with the pad 24. It is preferable to be able to control the depth of the cavity 34 accurately by the thickness of the insulating layer 28 in the third embodiment.

Seventh Embodiment

As a seventh embodiment, the electronic part of the invention has a structure in which a cavity 35 is formed across the regions of the insulating layer 28 and the substrate 10 and contacts with the pad 24. It is a structure in which the depth 36 of the cavity 35 is larger than the thickness of the insulating layer 28 in the aforementioned sixth embodiment. It becomes possible to fully relax the external stress caused by the bonding wire 22 by forming such membrane structure.

Figure 9:
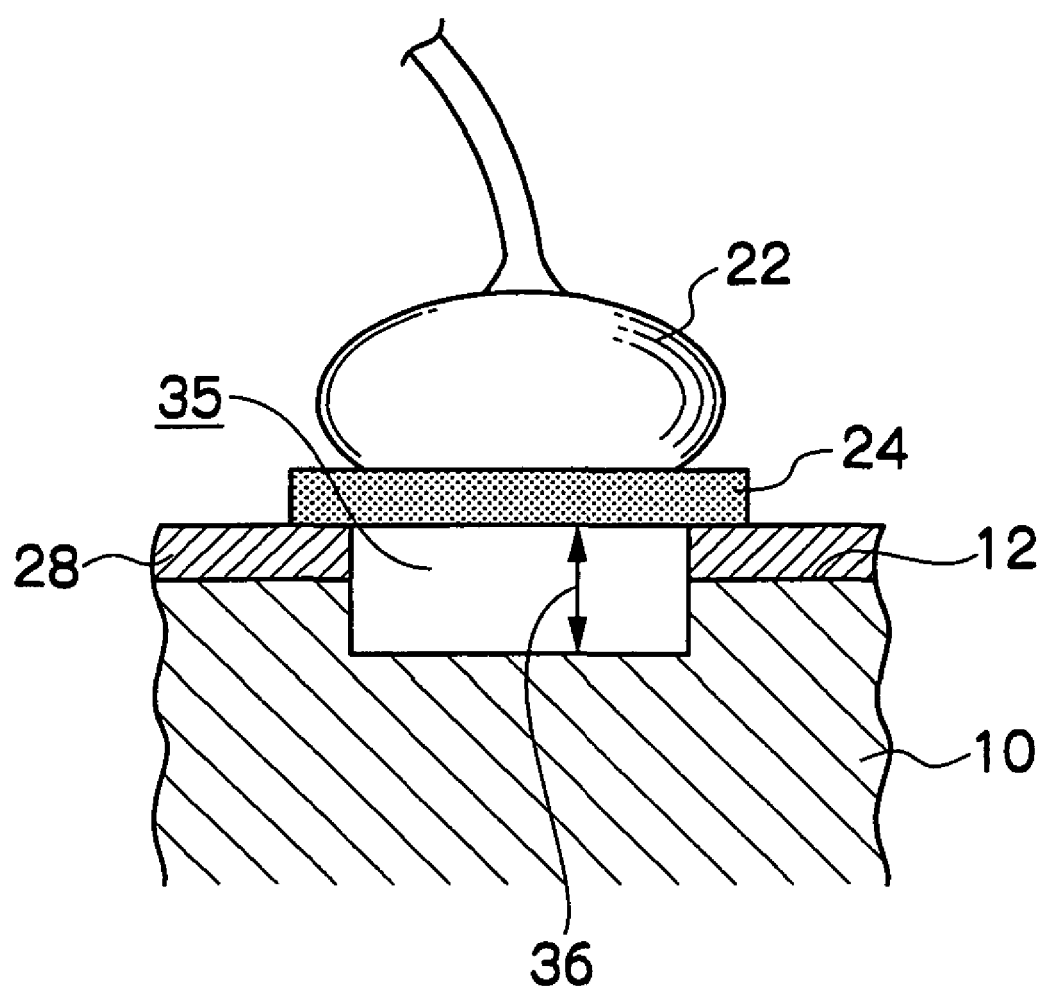
FIG. 9 is a section view of a seventh embodiment in the electronic part in the mode for carrying out the invention.
Figure 10A:
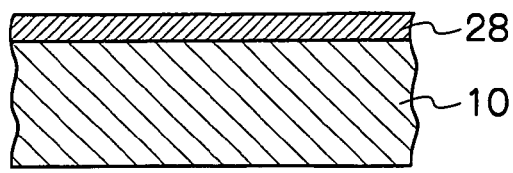
FIG. 10A is a section view of processing step of the first embodiment in the electronic part in the mode for carrying out the invention.
Figure 10B:
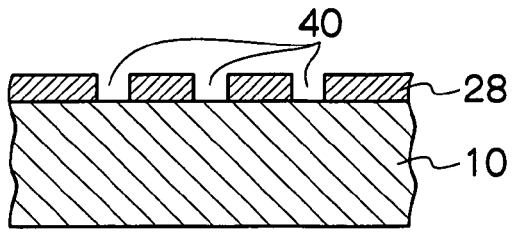
FIG. 10B is a section view of processing step of the first embodiment in the electronic part in the mode for carrying out the invention.
Figure 10C:
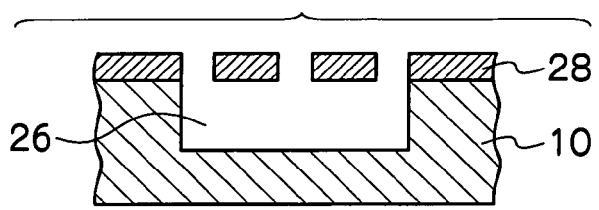
FIG. 10C is a section view of processing step of the first embodiment in the electronic part in the mode for carrying out the invention.
Figure 10D:
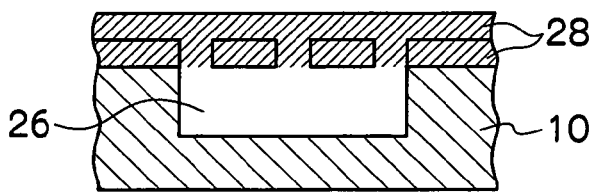
FIG. 10D is a section view of processing step of the first embodiment in the electronic part in the mode for carrying out the invention.
Figure 10E:
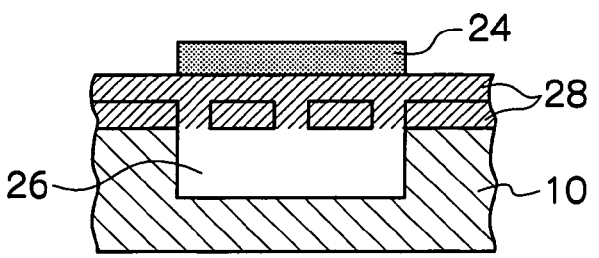
FIG. 10E is a section view of processing step of the first embodiment in the electronic part in the mode for carrying out the invention.
Figure 10F:
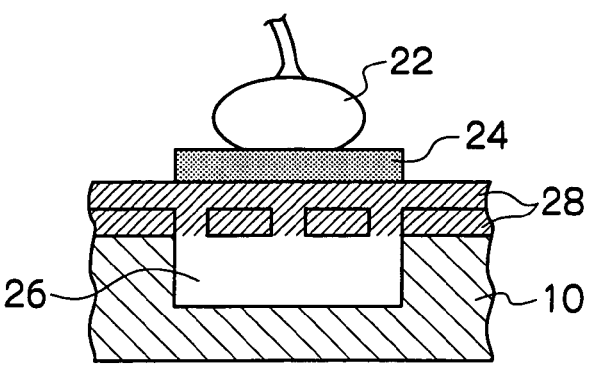
FIG. 10F is a section view of processing step of the first embodiment in the electronic part in the mode for carrying out the invention.
Figure 11A:
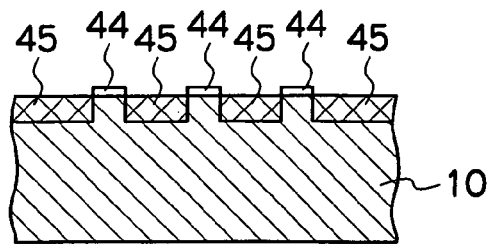
FIG. 11A is a section view of processing step of the second embodiment in the electronic part in the mode for carrying out the invention.
Figure 11B:
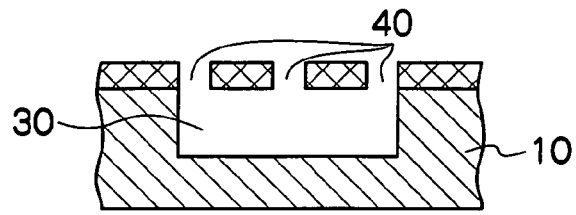
FIG. 11B is a section view of processing step of the second embodiment in the electronic part in the mode for carrying out the invention.
Figure 11C:
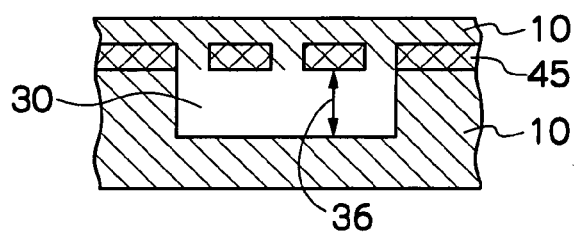
FIG. 11C is a section view of processing step of the second embodiment in the electronic part in the mode for carrying out the invention.
Figure 11D:
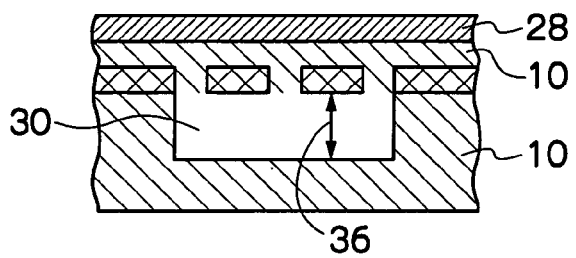
FIG. 11D is a section view of processing step of the second embodiment in the electronic part in the mode for carrying out the invention.
Figure 11E:
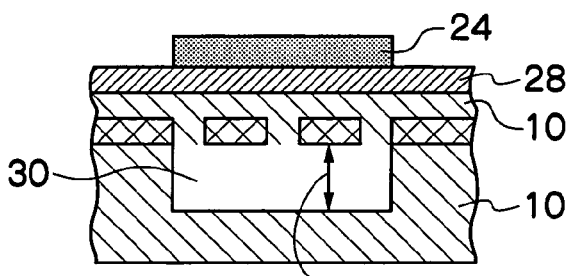
FIG. 11E is a section view of processing step of the second embodiment in the electronic part in the mode for carrying out the invention.
Figure 11F:
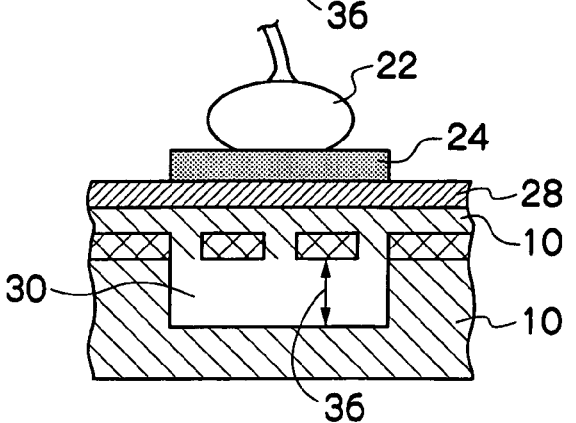
FIG. 11F is a section view of processing step of the second embodiment in the electronic part in the mode for carrying out the invention.
Figure 12A:
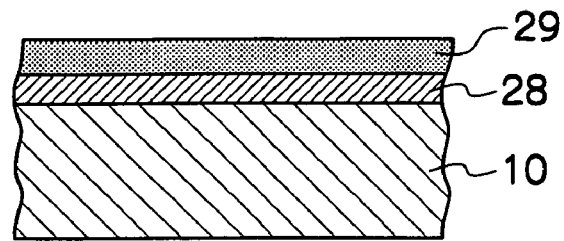
FIG. 12A is a section view of processing step of a sixth embodiment in the electronic part in the mode for carrying out the invention.
Figure 12B:
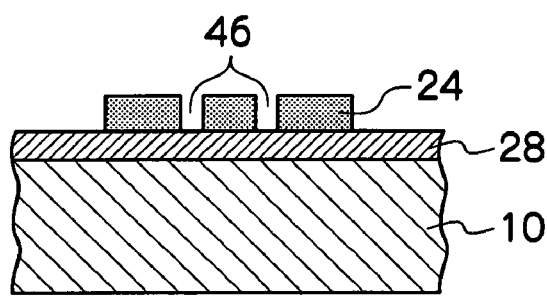
FIG. 12B is a section view of processing step of the sixth embodiment in the electronic part in the mode for carrying out the invention.
Figure 12C:
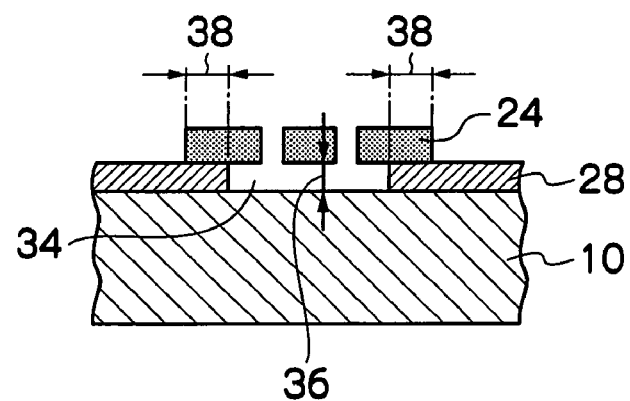
FIG. 12C is a section view of processing step of the sixth embodiment in the electronic part in the mode for carrying out the invention.
Figure 12D:
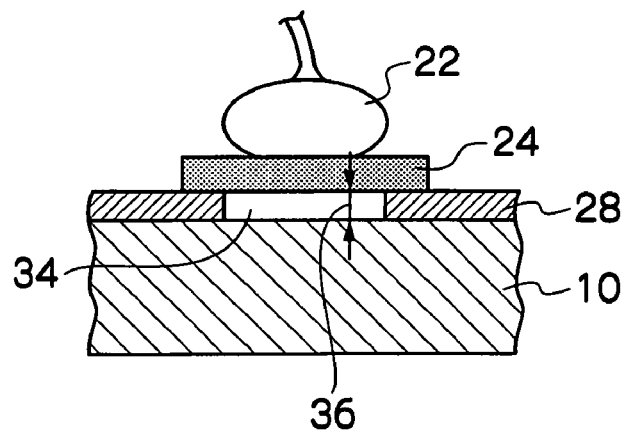
FIG. 12D is a section view of processing step of the sixth embodiment in the electronic part in the mode for carrying out the invention.
Figure 13A:
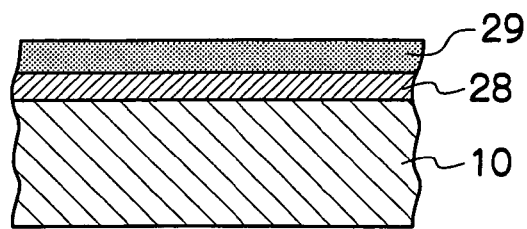
FIG. 13A is a section view of processing step of the seventh embodiment in the electronic part in the mode for carrying out the invention.
Figure 13B:
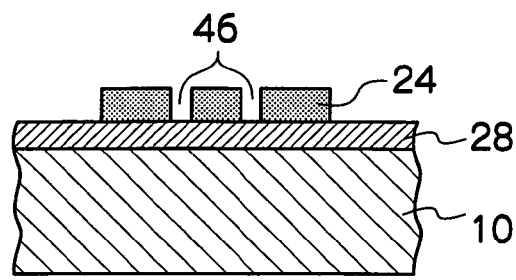
FIG. 13B is a section view of processing step of the seventh embodiment in the electronic part in the mode for carrying out the invention.
Figure 13C:
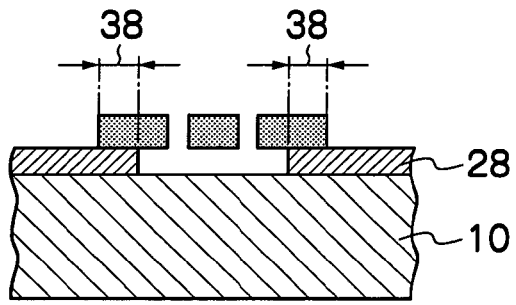
FIG. 13C is a section view of processing step of the seventh embodiment in the electronic part in the mode for carrying out the invention.
Figure 13D:
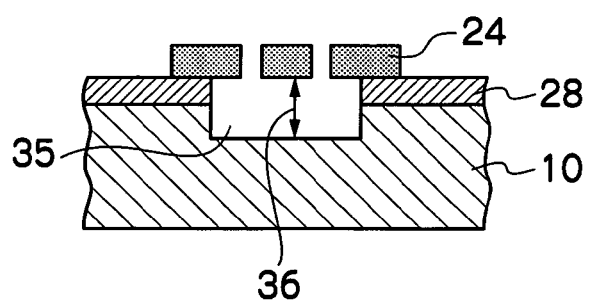
FIG. 13D is a section view of processing step of the seventh embodiment in the electronic part in the mode for carrying out the invention.
Figure 13E:
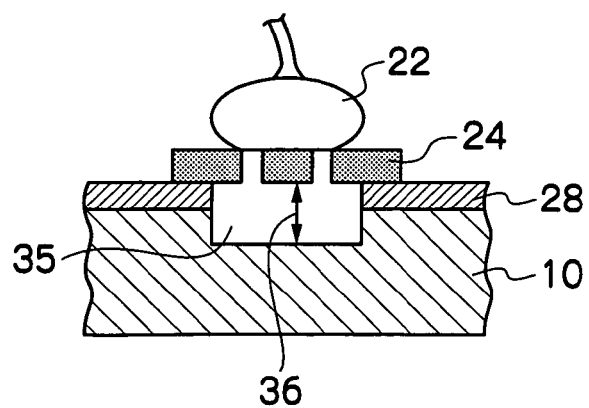
FIG. 13E is a section view of processing step of the seventh embodiment in the electronic part in the mode for carrying out the invention.

FIG. 9 is a section view of the electronic part having the substrate 10, the bonding wire 22, the pad 24, the cavity 35 and the insulating layer 28. The cavity 35 is located within the substrate 10. In this case, the pad 24 deflects when the bonding wire 22 is connected. That is, it deflects in such a direction in which the surface of the cavity 35 contacts with the bottom surface of the cavity 35.

As for a combination of the depth 36 of the cavity 35, the shape of the cavity 35, the area of the upper surface of the cavity 35 and the position corresponding to the bottom surface of the pad 24, it is preferable to be such that the depth 36 of the cavity 35 is larger than the thickness of the insulating layer 28 and is less than 10 times of the defection of the pad 24, the shape of the cavity 35 is circular or oval, the area of the upper surface of the cavity 35 is more than 50% and less than 90% of the area of the bottom surface of the pad 24 and a gap 38 between an outer periphery of the pad 24 and an outer periphery of the cavity 35 is 5% or more of the diameter of the pad. It becomes possible to fully relax the external stress by such cavity 35.

Here, the materials of the substrate 10, the pad 24, the insulating layer 28 and the bonding wire 22 are the same with those in the first embodiment.

Fabrication Method of Seventh Embodiment

A fabrication method of a seventh embodiment will be explained by using FIG. 13.

The substrate 10 on which the insulating layer 28 is formed is prepared. Then, an aluminum film 29 that is a material of the pad is formed and the pad 24 having etching holes 46 is formed by the known lithography technology. Next, the isotropic wet etching is carried out by the mixed solution of ammonium fluoride, ammonium hydrogen fluoride and acetic acid to form a cavity in the insulating layer 28 composed of a silicon oxide film without etching the aluminum film. After that, sulfur hexafluoride ($SF_6$) gas plasma etching is carried out on the substrate 10 to form the cavity 35. Then, the bonding wire 22 is connected with the pad 24. It becomes possible to fully relax the external stress because the depth 36 of the cavity 35 is fully large in the fourth embodiment as compared to that of the third embodiment described above.

It is thus possible to provide the highly reliable electronic part whose erroneous operation is suppressed because the electronic part of the invention can fully relax the external stress that is otherwise caused by the bonding wire by disposing the predetermined cavity at the predetermined position. The invention may be applied to various devices such as an acceleration sensor, a pressure sensor and a semiconductor device.

<Acceleration Sensor>

The acceleration sensor of the invention has a dead-weight section and a fixing section surrounding the dead-weight section and having an electrode pad wherein the dead-weight section is flexibly connected with the fixing section. The acceleration sensor further includes an insulating layer formed on the fixing section, an electrode pad formed on the insulating layer and is electrically connected with acceleration detecting means of the acceleration sensor and a cavity formed at least at either one of the substrate corresponding to a bottom surface of the electrode pad and a region of the insulating layer.

Specifically, the invention may be applied to the acceleration sensor by providing the flexible section in the electronic part of the first through seventh embodiments of the invention described above and by forming the piezoresistant elements in the flexible section. In this case, the cavity formed in the electronic part of the invention must not reach to the region of the flexible section. It is because the cavity absorbs deflection that is to be originally sensed and the sensitivity of the acceleration sensor drops if the cavity reaches to the flexible section.

<Fabrication Method of Acceleration Sensor>

The method for fabricating the acceleration sensor has a step of forming a piezoresistant element at a flexible portion in addition to the method for fabricating the aforementioned electronic part.

Figure 14:
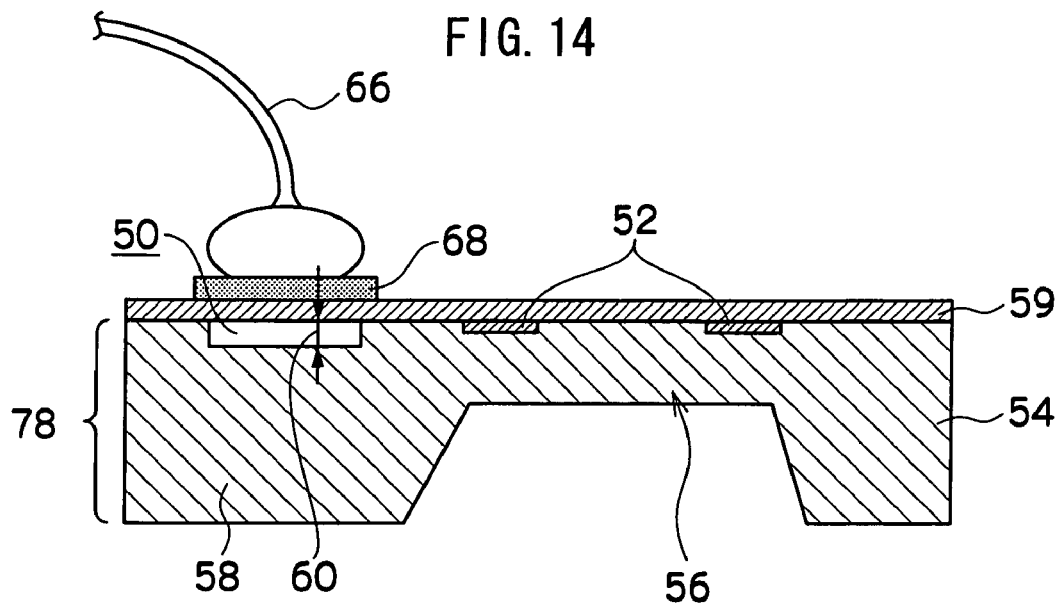
FIG. 14 is a section view of a piezoresistant-type acceleration sensor in the first embodiment of the invention.

For example, the following steps are carried out in fabricating the acceleration sensor in FIG. 14.

1 μm of silicon oxide film is formed on the surface of the substrate and windows (5 μm in width and 40 μm in length) of the silicon oxide film are opened at parts where piezo resistances are to be formed by the lithography technology. Then, piezoresistant elements 52 are formed by thermally diffusing boron (density: $1 \times 10^8/cm^3$) through the windows.

Next, 2 μm of silicon oxide film is formed, an etching hole is formed at a part of the silicon oxide film where the pad is to be formed by the lithography technology and wet etching is carried out by a KOH solution through the etching hole to create a cavity 50. Then, a silicon oxide film is filmed by atmospheric pressure CVD to cover the etching hole and to form an insulating layer 59.

In succession, a contact hole for taking out electrical signals from the piezoresistant element 52 is formed at piezo resistance regions of the insulating layer 59 by the lithography technology.

Next, an aluminum film is formed and the metallic film is patterned by the lithography technology to form a wire connecting the piezo resistance with the pad through the pad 68 and the contact hole. Then, after forming a silicon nitride film on the back of the substrate 78, etching is carried out on the substrate 78 to remove the silicon nitride film at part where a thin movable section is formed and the substrate is treated by the etching solution KOH to form a fixing section 58, the movable section 56 and a working section 54.

After that, the bonding wire 66 is connected with the pad 68.

It is noted that the embodiments described above should not be construed as definitive and it is needless to say that modifications thereof may be realized within a scope meeting the requirements of the invention.

Examples

Although the invention will be specifically explained by exemplifying embodiments, the invention is not limited them.

Among various electronic parts, the invention has been carried out in terms of an acceleration sensor.

First Example

Structure of First Example

FIG. 14 is a section view of a piezoresistant-type acceleration sensor to which the invention of Claim 2 is applied.

In the substrate 78 composed of the working section 54, the flexible section 56 and the fixing section 58, a concave portion is provided on a surface layer region of the fixing section 58 and the piezoresistant elements 52 are provided at end portions of the flexible section 56 and in the surface layer region of the flexible section 56.

The insulating layer 59 is formed so as to cover the surface of the concave portion, the piezoresistant element 52 and the substrate 78 and the membrane structure of the cavity 50 is formed by the concave portion of the substrate 78 and the insulating layer 59.

Here, a depth 60 of the cavity 50 is 10 μm, a shape of the cavity 50 seen from the side of the pad 68 is circular, an area of an upper surface of the cavity 50 is 3847 μm$^2$, an area of a bottom surface of the pad 68 is 5024 μm$^2$ and position of the cavity 50 corresponding to the bottom surface of the pad 68 is position where the center of gravity of the bottom surface of the pad 68 overlaps with the center of gravity of the cavity 50. Materials and thickness of each region other than the cavity 50 are as follows.

Components of First Embodiment

Substrate 78 (mono crystal Si, thickness: 100 μm)
Insulating layer 59 (silicon oxide film SiO$_2$, thickness: 1 μm)
Bonding wire 66 (Au, wire diameter: 30 μm)
Pad 68 (Al, diameter: 80 μm, thickness 2 μm, shape: circular
Piezoresistant element 52 (boron diffusion layer, 5 μm in width×40 μm in length, thickness: 1 μm)

Fabrication Method of First Example

1 μm of silicon oxide film is formed on the surface of the N-type silicon single crystalline substrate and a window (5 μm in width and 40 μm in length) of the silicon oxide film are opened at parts where the piezo resistances are to be formed by the lithography technology. Then, the piezoresistant elements 52 are formed by thermally diffusing boron (density: $1\times10^{18}/cm^3$) through the windows.

Next, 2 μm of silicon oxide film is formed, an etching hole is formed at the part of the silicon oxide film where the pad is to be formed by the lithography technology and wet etching is carried out by the KOH solution through the etching hole to create the cavity 50 of 10 μm in depth. Then, a silicon oxide film is filmed by atmospheric pressure CVD to cover the etching hole and to form the insulating layer 59.

In succession, a contact hole for taking out electrical signals from the piezoresistant element 52 is formed at piezo resistance regions of the insulating layer 59 by the lithography technology.

Next, an aluminum film is formed and the aluminum film is patterned by the lithography technology to form a wire connecting the piezo resistance 52 with the pad through the pad 68 and the contact hole. Then, after forming a silicon nitride film of 1 μm on the back of the substrate 78, etching is carried out on the substrate 78 to remove the silicon nitride film at the part where the thin movable section is formed and the substrate is treated by the etching solution KOH to form the fixing section 58, the movable section 56 and the working section 54.

After that, the bonding wire 66 is connected with the pad 68.

Second Example

Structure of Second Example

Figure 15:
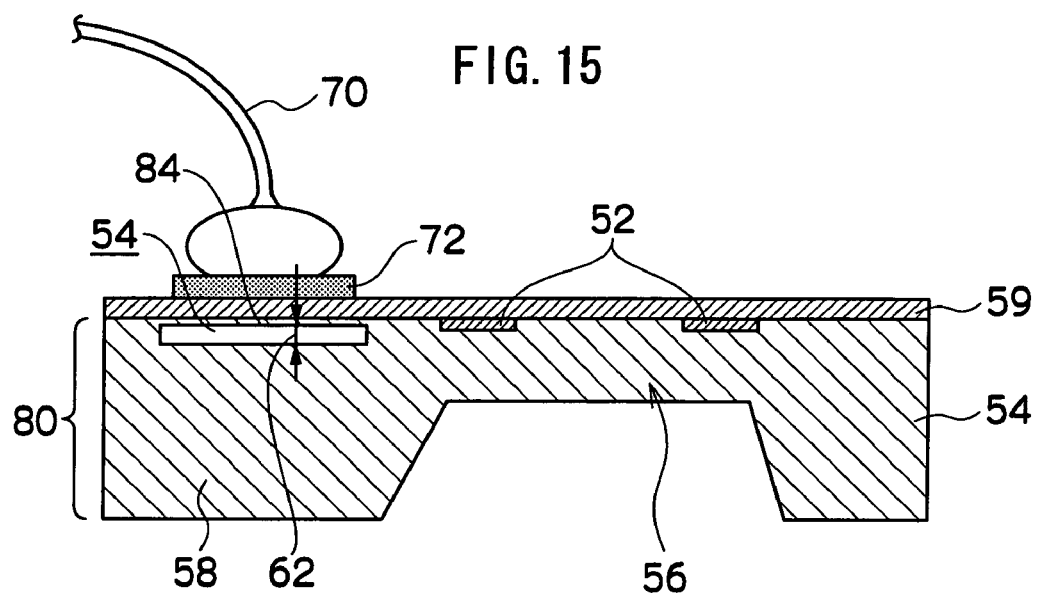
FIG. 15 is a section view of the piezoresistant-type acceleration sensor in the second embodiment of the invention.

FIG. 15 is a section view of a piezoresistant-type acceleration sensor to which the invention of second example is applied.

In a substrate 80 composed of the working section 54, the flexible section 56 and the fixing section 58, a cavity 54 is provided in the upper part of the fixing section 58 and the piezoresistant elements 52 are provided at end portions of the flexible section 56 and in the surface layer region of the flexible section 56.

The working section 54 is formed such that it is surrounded by a concave portion of the substrate 80 and a layer 84 between a surface of the working section 54 and the insulating layer 59. The insulating layer 59 is formed so as to cover the concave portion, the piezoresistant element 52 and the surface of the substrate 80. The membrane structure of the cavity 54 is formed by the concave portion of the substrate 80 and the insulating layer 59.

Here, a depth 62 of the working section 54 is 10 μm, a shape of the working section 54 seen from the side of the pad 72 is circular, an area of an upper surface of the working section 54 is 6359 μm$^2$, an area of a bottom surface of the pad 72 is 5024 μm$^2$ and position of the working section 54 corresponding to the bottom surface of the pad 72 is position where the center of gravity of the bottom surface of the pad 72 overlaps with the center of gravity of the working section 54. Materials and thickness of each region other than the working section 54 are as follows.

Components of Second Example

The materials of the substrate 80, the insulating layer 59, the bonding wire 70, the pad 72 and the piezoresistant element 52 are the same with the first embodiment. A material of the layer 84 between the surface of the working section 54 and the insulating layer 59 is mono crystal Si and its thickness is 1 μm.

Fabrication Method of Second Example

1 μm of silicon oxide film is formed on the surface of the N-type silicon mono crystal substrate, a pattern is formed by leaving a plurality of holes of 1 μm in diameter at a part where the pad of the silicon oxide film is to be formed lithography technology and boron is thermally diffused (density: $1\times10^{19}/cm^3$) to the excerpted portion of the pattern.

Next, after removing the silicon oxide film, wet etching is carried out by the KOH solution for 22 minutes to advance the etching from the hole pattern portion where boron is not diffused to create the working section 54 of 10 μm in depth having the layer of 1 μm in thickness between the surface of the working section 54 and the insulating layer 59. Then, a silicon oxide film is filmed by a normal pressure CVD to cover the etching hole and to form the insulating layer 59.

Next, a window (5 μm in width and 40 μm in length) of the silicon oxide film is opened at parts where the piezo resistances are to be formed by the lithography technology. Then, the piezoresistant elements 52 are formed by thermally diffusing boron (density: $1\times10^{18}/cm^3$) through the windows. Then, a silicon oxide film of 1 μm is formed.

In succession, a contact hole for taking out electrical signals from the piezoresistant element 52 is formed at piezo resistance regions of the insulating layer 59 by the lithography technology.

Next, an aluminum film of 2 μm in thickness is formed and the aluminum film is patterned by the lithography technology to form a wire connecting the piezo resistance with the pad through the pad 68 and the contact hole. Then, after forming the silicon nitride film of 1 μm on the back of the substrate 80, etching is carried out on the substrate 80 to remove the silicon nitride film at the part where the thin movable section is formed and the substrate is treated by the etching solution KOH to form the fixing section 58, the movable section 56 and the working section 54.

After that, the bonding wire 70 is connected with the pad 72.

Third Example

Structure of Third Example

Figure 16:
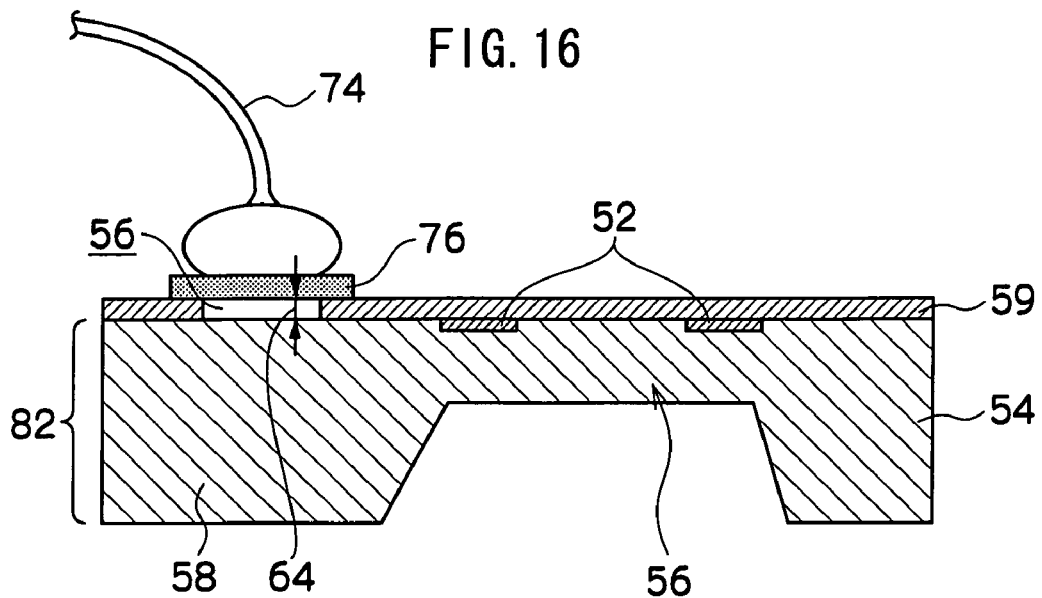
FIG. 16 is a section view of a piezoresistant-type acceleration sensor in the third embodiment of the invention.
Figure 17:
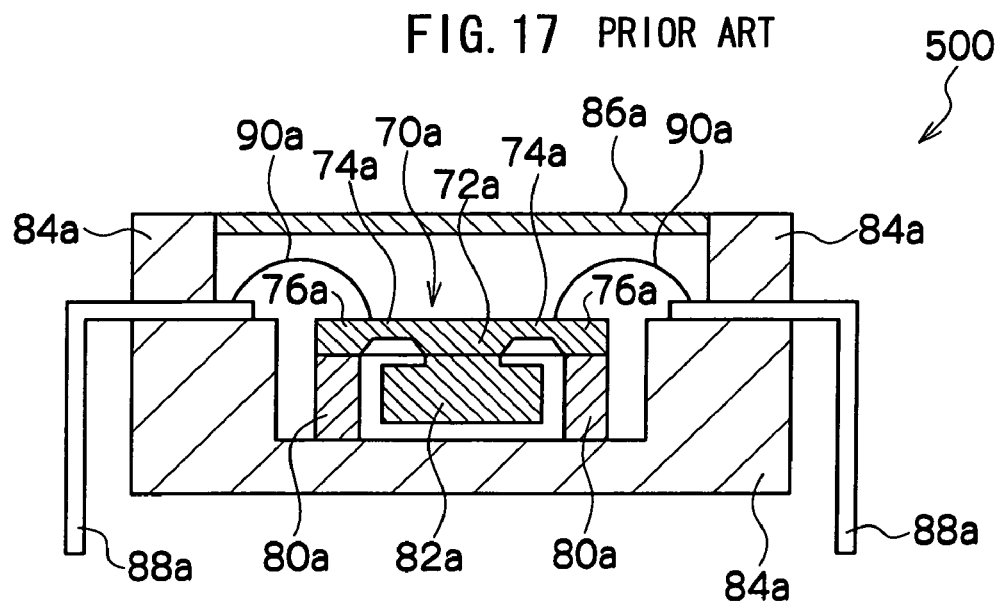
FIG. 17 is a section view of a prior art piezoresistant-type acceleration sensor.
Figure 18:
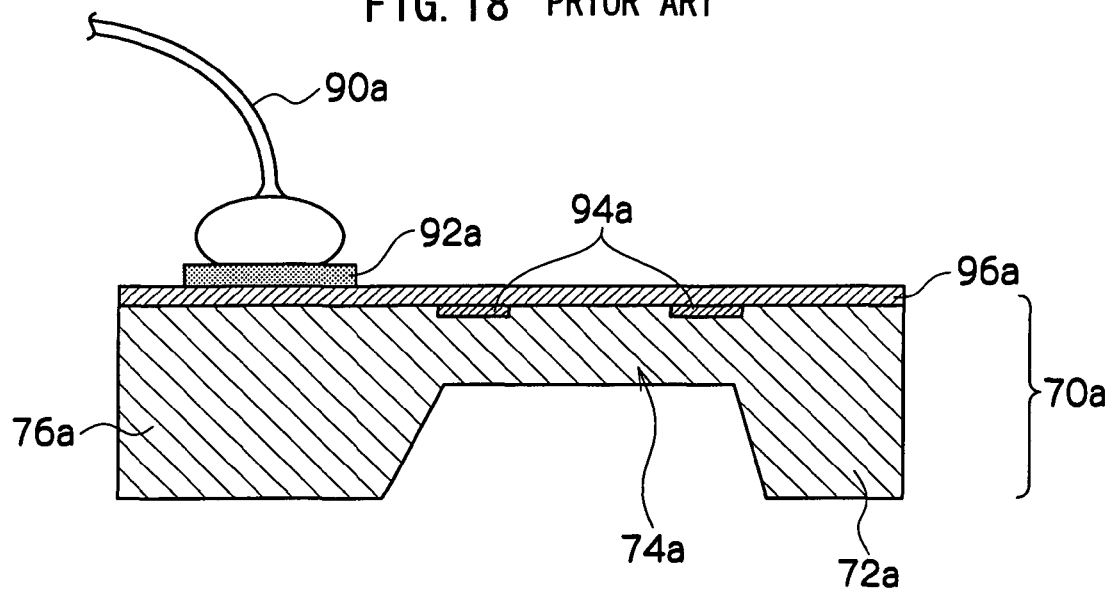
FIG. 18 is a perspective view near the pad in the section of the prior art piezoresistant-type acceleration sensor.

FIG. 16 is a section view of a piezoresistant-type acceleration sensor to which the invention of third example is applied.

In a substrate 82 composed of the working section 54, the flexible section 56 and the fixing section 58, a concave portion is provided in a surface layer region of the fixing section 58 and the piezoresistant elements 52 are provided at end portions of the flexible section 56 and in the surface layer region of the flexible section 56.

A cavity 56 is formed into a membrane structure by being surrounded by the substrate 82, the insulating layer 59 and the pad 76.

Here, a depth 64 of the flexible section 56 is 3 μm, a shape of the flexible section 56 seen from the side of the pad 76 is circular, an area of an upper surface of the flexible section 56 is 3847 μm², an area of a bottom surface of the pad 76 is 5024 μm² and position of the flexible section 56 corresponding to the bottom surface of the pad 76 is position where the center of gravity of the bottom surface of the pad 76 overlaps with the center of gravity of the flexible section 56. Materials and thickness of each region other than the flexible section 56 are as follows.

Components of Third Example

The materials and thickness of the substrate 82, the insulating layer 59, the bonding wire 74, the pad 76 and the piezoresistant element 52 are the same with the first embodiment.

Fabrication Method of Third Example

1 μm of silicon oxide film is formed on the surface of the N-type silicon mono crystal substrate and a window (5 μm in width and 40 μm in length) of the silicon oxide film is opened at parts where the piezoresistant elements 52 are to be formed by the lithography technology. Then, the piezoresistant elements 52 are formed by thermally diffusing boron (density: $1\times10^{18}/cm^3$) through the windows.

Next, a contact hole for taking out electrical signals from the piezoresistant element 52 is formed at piezo resistance regions of the insulating layer 59 by the lithography technology.

Next, an aluminum film of 2 μm in thickness that is a material of the pad is formed and is patterned by the lithography technology to form the pad 76 having the etching hole and a wire connecting the piezoresistant element 52 with the pad through the pad 76 and the contact hole. Here, a resist used in the lithography is not removed and isotropic wet etching is carried out by the mixed solution of ammonium fluoride, ammonium hydrogen fluoride and acetic acid to form a flexible section 56 in the insulating layer 59 composed of the silicon oxide film without etching the aluminum film. Then, the resist is removed by oxygen plasma.

Then, after forming the silicon nitride film of 1 μm on the back of the substrate 82, etching is carried out on the substrate 82 to remove the silicon nitride film at the part where the thin movable section is formed and the substrate is treated by the etching solution KOH to form the fixing section 58, the movable section 56 and the working section 54.

After that, the bonding wire 74 is connected with the pad 76.

It is possible to obtain the highly reliable acceleration sensor whose troubles such as erroneous operation and damage are reduced by the piezoresistant-type acceleration sensor fabricated as described in the first through third embodiments.

What is claimed is:

1. An electronic part, comprising:
   a substrate;
   an insulating layer formed on the substrate; and
   an electrode pad formed on the insulating layer and electrically connected with an external terminal,
   wherein a cavity is formed at at least one of a region of the substrate corresponding to a bottom surface of the electrode pad and a region of the insulating layer corresponding to the bottom surface of the electrode pad.

2. The electronic part according to claim 1, wherein the electrode pad is connected with the external terminal via a bonding wire.

3. The electronic part according to claim 1, wherein the electrode pad is connected with the external terminal via a bump.

4. The electronic part according to claim 1, wherein the cavity is formed in the substrate so as to contact the insulating layer.

5. The electronic part according to claim 1, wherein the cavity is formed inside the substrate.

6. The electronic part according to claim 1, wherein the cavity is formed in the insulating layer.

7. The electronic part according to claim 6, wherein the cavity contacts the substrate.

8. The electronic part according to claim 6, wherein the cavity contacts the electrode pad.

9. The electronic part according to claim 6, wherein the cavity contacts both of the substrate and the electrode pad.

10. The electronic part according to claim 1, wherein the cavity is formed across the insulating layer and the substrate so as to contact with the electrode pad.

11. An improved acceleration sensor, having detector means for detecting acceleration, an electrode pad, a dead-weight section, and a substrate having a fixing section surrounding the dead-weight section, the dead-weight section being flexibly connected with the fixing section, wherein the improvement comprises:
   an insulating layer is formed on the fixing section;
   the electrode pad is disposed on the insulating layer and is electrically connected with the detecting means; and
   a cavity is formed at least one of a region of the substrate corresponding to a bottom surface of the electrode pad and a region of the insulating layer corresponding to the bottom surface of the electrode pad.

12. The acceleration sensor according to claim 11, wherein the electrode pad is connected with an external terminal via a bonding wire.

13. The acceleration sensor according to claim 11, wherein the electrode pad is connected with an external terminal via a bump.

14. The acceleration sensor according to claim 11, wherein the cavity is formed in the substrate so as to contact the insulating layer.

15. The acceleration sensor according to claim 11, wherein the cavity is formed inside the substrate.

16. The acceleration sensor according to claim 11, wherein the cavity is formed in the insulating layer.

17. The acceleration sensor according to claim 16, wherein the cavity contacts the substrate.

18. The acceleration sensor according to claim 16, wherein the cavity contacts the electrode pad.

19. The acceleration sensor according to claim 16, wherein the cavity contacts both of the substrate and the electrode pad.

20. The acceleration sensor according to claim 11, wherein the cavity is formed across the insulating layer and the substrate so as to contact with the electrode pad.

21. An electronic part, comprising:
a substrate having top and bottom sides;
an insulating layer on the top side of the substrate; and
an electrode pad on the insulating layer,
wherein a cavity is disposed between the bottom side of the substrate and the electrode pad, and
wherein a line drawn substantially perpendicular to the bottom side of the substrate passes through the cavity and the electrode pad.

22. An electronic part according to claim 21, further comprising means, supported by the substrate, for detecting acceleration.

* * * * *